United States Patent
Lee et al.

(10) Patent No.: US 12,557,714 B2
(45) Date of Patent: Feb. 17, 2026

(54) METHOD FOR MAKING ELECTRONIC PACKAGE

(71) Applicant: JCET STATS ChipPAC Korea Limited, Incheon (KR)

(72) Inventors: SeungHyun Lee, Incheon (KR); KyoungHee Park, Seoul (KR); HunTaek Lee, Gyeonggi-do (KR); KyungHwan Kim, Seoul (KR); WonSang Rhee, Incheon (KR)

(*) Notice: Subject to any disclaimer, the term of this patent is extended or adjusted under 35 U.S.C. 154(b) by 376 days.

(21) Appl. No.: 18/451,115

(22) Filed: Aug. 17, 2023

(65) Prior Publication Data
US 2024/0071991 A1  Feb. 29, 2024

(30) Foreign Application Priority Data
Aug. 26, 2022 (CN) .......................... 202211032114.5

(51) Int. Cl.
*H01L 23/00* (2006.01)
*H01L 21/56* (2006.01)
(Continued)

(52) U.S. Cl.
CPC ............ *H01L 24/97* (2013.01); *H01L 21/563* (2013.01); *H01L 21/6836* (2013.01);
(Continued)

(58) Field of Classification Search
CPC ... H01L 24/97; H01L 21/563; H01L 21/6836; H01L 23/49816; H01L 23/66;
(Continued)

(56) References Cited

U.S. PATENT DOCUMENTS

| | | |
|---|---|---|
| 10,418,687 B2 | 9/2019 | Mow et al. |
| 10,887,994 B2 | 1/2021 | Kim et al. |

(Continued)

FOREIGN PATENT DOCUMENTS

| | | |
|---|---|---|
| CN | 110024114 A | 7/2019 |
| CN | 113889458 A | 1/2022 |

(Continued)

*Primary Examiner* — Mark W Tornow
(74) *Attorney, Agent, or Firm* — Junhe Law Office, P.C.; Yi Zhang

(57) ABSTRACT

A method for making an electronic package is provided. The method includes providing a substrate strip comprising substrate assemblies, each substrate assembly comprises a first substrate and a second substrate connected to the first substrate via a flexible link, the first substrate comprises a first mounting surface, the second substrate comprises a second mounting surface that is not at a same side of the substrate assembly as the first mounting surface; disposing the substrate strip on a first carrier; attaching a first electronic component onto the first mounting surface; disposing the substrate strip on a second carrier with a plurality of cavities, the first electronic component is received within one of the plurality of cavities; attaching a second electronic component onto the second mounting surface; singulating the substrate assemblies from each other; and bending the flexible link to form an angle between the first substrate and the second substrate.

9 Claims, 5 Drawing Sheets

(51) Int. Cl.
    *H01L 21/683* (2006.01)
    *H01L 23/498* (2006.01)
    *H01L 23/66* (2006.01)
(52) U.S. Cl.
    CPC ........ *H01L 23/49816* (2013.01); *H01L 23/66* (2013.01); *H01L 2223/6616* (2013.01); *H01L 2223/6644* (2013.01); *H01L 2223/6677* (2013.01); *H01L 2224/97* (2013.01); *H01L 2924/1421* (2013.01); *H01L 2924/15153* (2013.01); *H01L 2924/1811* (2013.01)
(58) Field of Classification Search
    CPC ..... H01L 2223/6616; H01L 2223/6644; H01L 2223/6677; H01L 2224/97; H01L 2924/1421; H01L 2924/15153; H01L 2924/1811; H01L 23/3128; H01L 23/552; H01L 25/0655; H01L 2221/68331; H01L 2221/68345; H01L 2221/68359; H01L 2221/68368; H01L 21/6835; H01L 23/5387; H01L 21/561; H01L 23/52; H01L 25/50; H05K 1/181; H05K 1/189; H05K 3/341; H05K 3/361

See application file for complete search history.

(56) References Cited

U.S. PATENT DOCUMENTS

| | | | |
|---|---|---|---|
| 10,931,000 | B1 | 2/2021 | Kang et al. |
| 11,239,573 | B2 | 2/2022 | Shah et al. |
| 2015/0163937 | A1* | 6/2015 | McClatchie ........... H05K 1/147 361/728 |
| 2018/0159209 | A1* | 6/2018 | Mikata ................... B32B 27/06 |
| 2019/0103653 | A1* | 4/2019 | Jeong ..................... H01Q 1/243 |
| 2020/0015357 | A1* | 1/2020 | Kim ........................ H01Q 1/22 |
| 2021/0091017 | A1* | 3/2021 | Yeon ....................... H01L 24/16 |
| 2021/0280959 | A1* | 9/2021 | Han ..................... H01L 23/5386 |

FOREIGN PATENT DOCUMENTS

| | | |
|---|---|---|
| TW | M585366 U | 10/2019 |
| TW | 202207530 A | 2/2022 |

* cited by examiner

METHOD FOR MAKING ELECTRONIC PACKAGE

TECHNICAL FIELD

The present application generally relates to semiconductor technology, and more particularly, to a method for making an electronic package.

BACKGROUND OF THE INVENTION

In recent years, wireless communication using millimeter-wave signals (e.g., with a frequency of 24 to 60 gigahertz (GHz) or higher) is faced with complex challenges as the electronic package is generally dictated by cost, size, and weight as well as a performance specification. Therefore, 5 G antenna-in-package (AIP) with system and antenna integrated into one package has been adopted for mobile handsets or other portable multimedia devices. However, this 5G AIP requires reduced interface pitches, more interface pin counts, reduced thickness, and higher-level integration within the system base package.

Therefore, a need exists for making an electronic package such as the 5G AIPs.

SUMMARY OF THE INVENTION

An objective of the present application is to provide a method for making an electronic package.

According to an aspect of embodiments of the present application, a method for making an electronic package is provided. The method includes providing a substrate strip comprising a plurality of substrate assemblies, wherein each substrate assembly comprises a first substrate and a second substrate that is connected to the first substrate via a flexible link, and wherein the first substrate of each substrate assembly comprises a first mounting surface and the second substrate of each substrate assembly comprises a second mounting surface that is not at a same side of the substrate assembly as the first mounting surface; disposing the substrate strip on a first carrier such that the first mounting surface of each first substrate is facing away from the first carrier and the second mounting surface of each second substrate is facing towards the first carrier; attaching a first electronic component onto the first mounting surface of each first substrate; disposing the substrate strip on a second carrier with a plurality of cavities, such that the first mounting surface of each first substrate is facing towards the second carrier and the second mounting surface of the second substrate is facing away from the second carrier, and the first electronic component attached onto each first substrate is received within one of the plurality of cavities; attaching a second electronic component onto the second mounting surface of each second substrate; separating the plurality of substrate assemblies from each other; and bending the flexible link of each substrate assembly to form an angle between the first substrate and the second substrate of each substrate assembly.

It is to be understood that both the foregoing general description and the following detailed description are exemplary and explanatory only and are not restrictive of the invention. Further, the accompanying drawings, which are incorporated in and constitute a part of this specification, illustrate embodiments of the invention and together with the description, serve to explain the principles of the invention.

BRIEF DESCRIPTION OF DRAWINGS

The drawings referenced herein form a part of the specification. Features shown in the drawing illustrate only some embodiments of the application, and not of all embodiments of the application, unless the detailed description explicitly indicates otherwise, and readers of the specification should not make implications to the contrary.

The same reference numbers will be used throughout the drawings to refer to the same or like parts.

DETAILED DESCRIPTION OF THE INVENTION

The following detailed description of exemplary embodiments of the application refers to the accompanying drawings that form a part of the description. The drawings illustrate specific exemplary embodiments in which the application may be practiced. The detailed description, including the drawings, describes these embodiments in sufficient detail to enable those skilled in the art to practice the application. Those skilled in the art may further utilize other embodiments of the application, and make logical, mechanical, and other changes without departing from the spirit or scope of the application. Readers of the following detailed description should, therefore, not interpret the description in a limiting sense, and only the appended claims define the scope of the embodiment of the application.

In this application, the use of the singular includes the plural unless specifically stated otherwise. In this application, the use of "or" means "and/or" unless stated otherwise. Furthermore, the use of the term "including" as well as other forms such as "includes" and "included" is not limiting. In addition, terms such as "element" or "component" encompass both elements and components including one unit, and elements and components that include more than one subunit, unless specifically stated otherwise. Additionally, the section headings used herein are for organizational purposes only and are not to be construed as limiting the subject matter described.

As used herein, spatially relative terms, such as "beneath", "below", "above", "over", "on", "upper", "lower", "left", "right", "vertical", "horizontal", "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Figure 1:
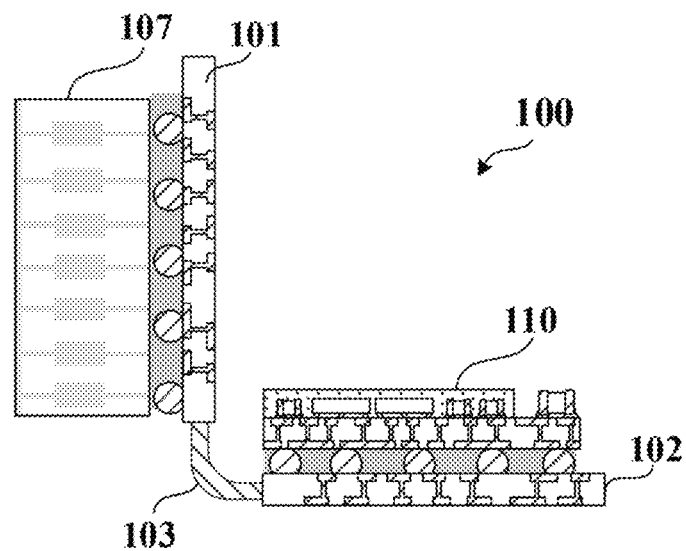
FIG. 1 illustrates a cross-sectional view of an electronic package 100 according to an embodiment of the present application.

FIG. 1 illustrates a cross-sectional view of an electronic package 100 according to an embodiment of the present application. The electronic package 100 may include various electronic components and substrates for mounting such electronic components.

As shown in FIG. 1, the electronic package 100 is in an L-shaped configuration, including a curved portion such as a flexible link 103 (e.g., with a bend angle of approximately ninety degrees) connecting a first substrate 101 and a second substrate 102. Specifically, a first electronic component 107 such as an antenna assembly may be disposed on the first substrate 101, and a second electronic component 110 such as a semiconductor package may be disposed on the second substrate 102. In some embodiments, the flexible link 103 may be a polymer tape or sheet (e.g., a polyimide film) with interconnect wires embedded therein or coated thereon. In this way, the first electronic component 107 and the second electronic component 110 mounted on two different substrates 101 and 102 can be electrically connected with each other, forming an integrated electronic package. However, it can be appreciated that other alternative interconnect structures such as flat cables or the like can be additionally disposed between the first and second substrates 101 and 102.

Figure 2:
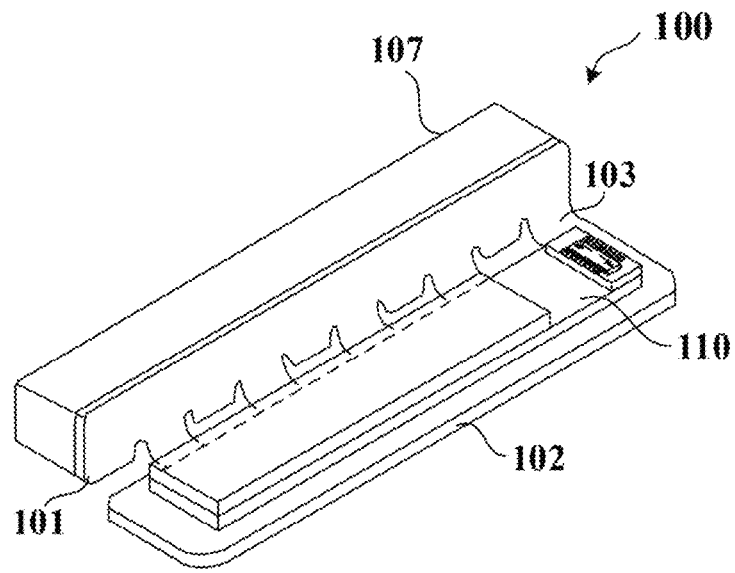
FIG. 2 illustrates a three-dimensional view of the electronic package 100 shown in FIG. 1.

FIG. 2 illustrates a three-dimensional view of the electronic package 100 shown in FIG. 1. It can be seen that the L-shaped electronic package 100 is compact in structure, which significantly reduces the number of laminated layers and the thickness of the electronic package, compared to conventional multi-layer electronic packages. As shown in FIGS. 1 and 2, the first electronic component 107 and the second electronic component 110 are mounted on two sides of the linked substrates 101 and 102, to avoid interference when the flexible link 103 is bent to a right angle as shown in FIG. 1. However, such non-planar configuration of the electronic package 100 increases difficulty in the assembling and manufacturing of the electronic package 100, especially for the mass production of such electronic packages. In order to resolve the problem, a new method for making the L-shaped electronic package is proposed according to some embodiment of the present application.

Referring to FIGS. 3A to 3I, various step of a method for making an electronic package is illustrated according to an embodiment of present application. For example, the method may be used to make the electronic package 100 shown in FIG. 1. In the following, the method will be described with reference to FIGS. 3A to 3I in more details.

Figure 3A:
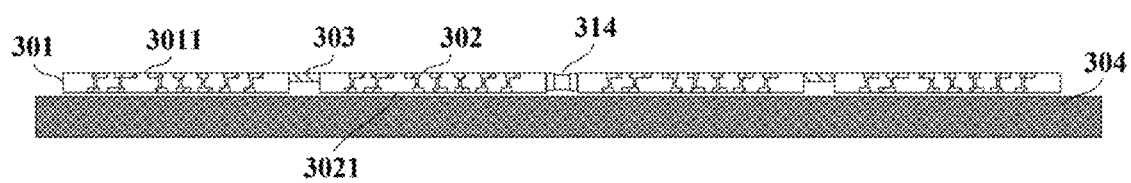
FIGS. 3A to 3I illustrate various steps of a method for making an electronic package according to an embodiment of present application.

As shown in FIG. 3A, a substrate strip including a plurality of substrate assemblies is provided. In some embodiments, the plurality of substrate assemblies of the substrate strip may be arranged in a row and connected together as a chain. In some other embodiments, the plurality of substrate assemblies of the substrate strip may be arranged in an array with multiple rows and columns. In this way, the plurality of substrate assemblies can be processed simultaneously to improve the efficiency of the manufacturing process.

In the embodiment shown in FIG. 3A, the substrate strip includes two substrate assemblies, and the two substrate assemblies are separated from each other by a singulation channel 314. The singulation channel 314 can provide a cutting area to singulate the substrate strip into two individual substrate assemblies. In some embodiments, the singulation channel 314 can be made of a rigid material, such as the material(s) the same as the substrates it is connecting. In some alternative embodiments, the singulation channel 314 can be made of a flexible material, such as polyimide or other similar polymeric materials. Since the singulation channel 314 needs to be cut or in other manners broken in a subsequent step, it is preferred that the singulation channel 314 is made of a material that is easily cut, for example, using a laser ablation process.

Each substrate assembly includes a first substrate 301, a second substrate 302, and a flexible link 303 disposed between the first substrate 301 and the second substrate 302. The first substrate 301 and the second substrate 302 may be rigid printed circuit boards (PCB) or flexible printed circuit boards (FPC). In some embodiments, the first substrate 301 and the second substrate 302 may include a redistribution structure (RDS) having one or more dielectric layers and one or more conductive layers between and through the dielectric layers. The conductive layers may define pads, traces and plugs through which electrical signals or voltages can be distributed horizontally and vertically across the RDS. In some embodiments, the RDS may include a plurality of conductive patterns formed on the surfaces of the first substrate 301 and second substrate 302.

The various electronic components can be mounted onto the first substrate 301 and the second substrate 302. Specifically, the first substrate 301 includes a first mounting surface 3011 and the second substrate 302 includes a second mounting surface 3021 that is not at the same side of the substrate assembly as the first mounting surface 3011. As shown in FIG. 3A, when the substrate strip is disposed on a first carrier 304 such as a metal or glass carrier, the first mounting surface 3011 of the first substrate 301 is facing away from the first carrier 304, i.e., oriented in an upward direction, and the second mounting surface 3021 of the second substrate 302 is facing towards the first carrier 304, i.e., oriented in a downward direction. One or more signals may be transmitted over the flexible link 303, including but limited to power signals and control signals. In some embodiments, the signals are transmitted over one or more separate wires or cables of the flexible link 303, and the signal transmission in the flexible link 303 can be bi-directional. For example, the flexible link 303 may be a flex cable or flexible circuit board. It can be appreciated that the flexible link 303 may be connected with the first substrate 301 and the second substrate 302 in any suitable known technology, which is not limited herein.

Figure 3B:
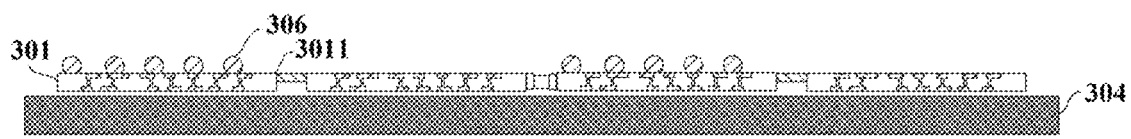

Afterwards, as shown in FIG. 3B, a plurality of bumps 306 are formed over the first mounting surface 3011 of each first substrate 3011. The bumps 306 can be formed using one of or any combination of the following process: evaporation, electrolytic plating, electroless plating, ball drop, or screen-printing process. The conductive bump material can be Al, Sn, Ni, Au, Ag, lead (Pb), bismuth (Bi), Cu, solder, or combinations thereof, with an optional flux solution. For example, the bump material can be eutectic Sn/Pb, high-lead solder, or lead-free solder. In some embodiments, the bump material may be bonded to the first mounting surface 3011 of each first substrate 301 using a suitable attachment or bonding process. In an embodiment, the bump material may be reflowed by heating the material above its melting point to form conductive balls or bumps. In some embodiments, the plurality of bumps 306 can also be compression bonded or thermocompression bonded to the first mounting surface 3011.

Figure 3C:
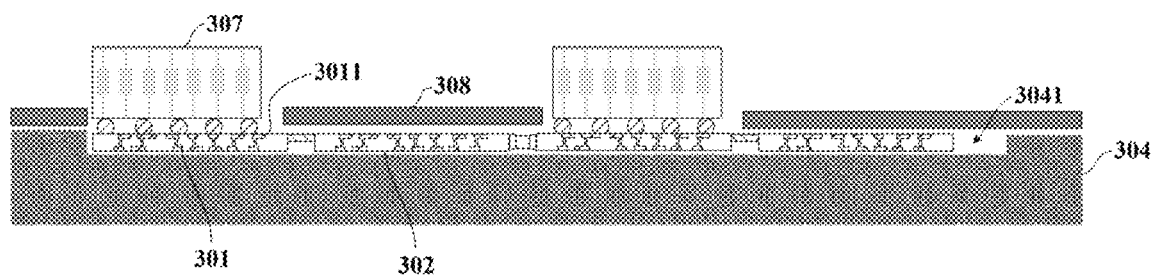

Afterwards, as shown in FIG. 3C, a first electronic component 307 is attached onto the first mounting surface 3011 of each first substrate 301. In some embodiments, before attaching the first electronic components 307, a first substrate mask 308 having a plurality of first openings is disposed onto the first mounting surface 3011 of the first substrate 301. Each first opening is aligned with the first substrate 301 of a substrate assembly, to expose the first mounting surface 3011 of the first substrate 301. In this way, the first electronic component 307 can be precisely mounted onto the first mounting surface 3011 of the first substrate 301 through the corresponding first opening. At the same time, the second substrate 302 can be covered by the first substrate mask 308 during the attaching process.

In some embodiments, the first electronic component 307 may be an antenna mounted onto the first substrate 301. In some embodiments, the antenna may be a dielectric resonator antenna (DRA) including dielectric resonators and antenna feed. Dielectric resonators are provided for transmitting and receiving millimeter wave antenna signals with different frequencies and/or communication protocols, which are generally made of materials with low loss and high dielectric constant, for example, the dielectric resonators may be made of polymer materials. In some embodiments, the dielectric resonator antenna is designed as any three-dimensional shape, including cylinder, rectangle, sphere or ring, for example. The rectangular dielectric resonator is merely illustrated as an example in FIG. 3C. In some embodiments, the antenna feed is provided for coupling the input of an electromagnetic signal to dielectric resonators. The common antenna feed is microstrip direct coupling feeding, microstrip slot coupling feeding, coplanar waveguide feeding, coaxial probe feeding and dual feeding structure.

In some embodiments, the first substrate mask 308 is a metal cover made of a metal material (e.g., stainless steel, aluminum, etc.) or any other suitable material (e.g., plastics), or a combination of these materials to prevent substrate warpage during the attaching process. The first substrate mask 308 can be removed from the substrate strip after the attaching process. In this way, the first substrate mask 308 can be reused for other substrate strips for mounting the first electronic components on the respective first substrates.

Figure 3D:
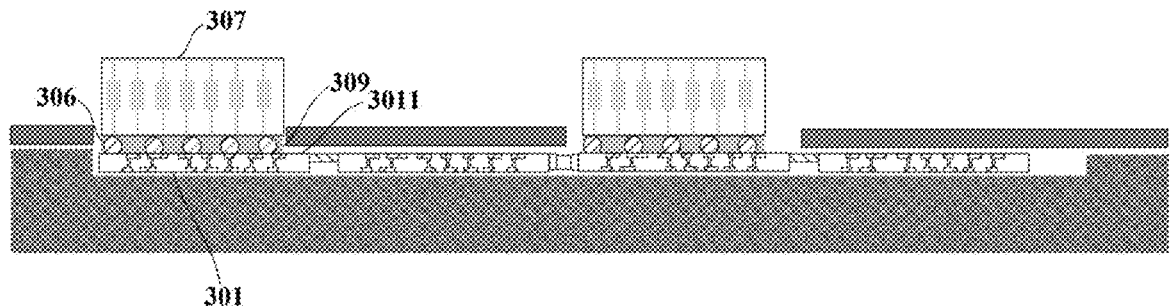

In some embodiments, the first carrier 304 may have a planar top surface, such that the first substrate mask 308 may be directly supported by the substrate strip. However, in some alternative embodiments, such as the embodiment shown in FIG. 3C, the first carrier 304 may include a substrate strip cavity 3041 for receiving the substrate strip. The substrate strip cavity 3041 has a depth greater than the height of the substrate strip to accommodate the substrate strip in whole. As such, the first substrate mask 308 can be supported by the first carrier 304, without being in direct contact with the substrate strip and potential contamination to the surfaces of the substrate strip. Afterwards, as shown in FIG. 3D, each first electronic component 307 is clamped onto the respective first mounting surface 3011 to secure it on the respective first mounting surface 3011. For example, the corners of the first electronic component 307 may be pressed against the bumps 306. Next, an encapsulant 309 such as an underfill material is injected into a gap between the first electronic component 307 and the first mounting surface 3011 of the first substrate 301 to ensure that the encapsulant 309 fully fills the space surrounding the plurality of bumps 306. The encapsulant 309 is cured or heated after injection, which ensures that the first electronic component 307 is securely fixed on the first mounting surface 3011. In some embodiments, the encapsulant 309 may be polymer composite material, such as the combination of epoxy, binder and other filler. The encapsulant 309 is non-conductive and environmentally protects the first electronic component 307 from external elements and contaminants and strengthens the reliability after the completion of the assembling process.

Figure 3E:
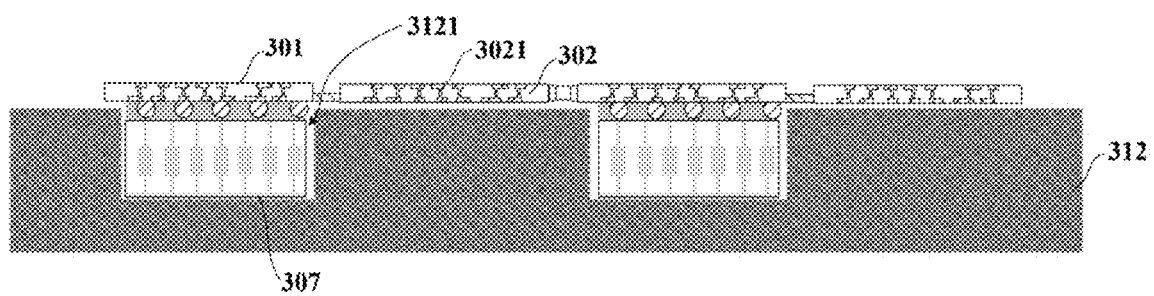

As shown in FIG. 3E, the first substrate mask 308 is removed from the first carrier 304. Then, the substrate strip is flipped over and disposed on a second carrier 312 with a plurality of cavities 3121. As such, the first mounting surface 3011 of each first substrate 301 is facing towards the second carrier 312, i.e., oriented downwards, and the second mounting surface 3021 of the second substrate 302 is facing away from the second carrier 312, i.e., oriented upwards. Each first electronic component 307 is then received within one of the plurality of cavities 3121. The second carrier 312 as shown in FIG. 3E may have the same structure and material as the first carrier 304 as shown in FIG. 3A and will not be elaborated herein. In some embodiments, each one of the plurality of cavities 3121 has a depth greater than the height of the first electronic component 307 to fully accommodate the first electronic component 307 therein. Accordingly, the first substrate 301 may substantially cover the opening of a cavity 3121, with its periphery supported by an edge of the cavity 3121. In this way, the first substrate 301 can be at the same level as the second substrate 302, which facilitates further processing (e.g., solder printing) to the substrate strip. In the embodiment shown in FIG. 3A to 3I, the first substrate 301 and the second substrate 302 may have the same thickness. In some alternative embodiments, the first substrate 301 and the second substrate 302 may have different thicknesses. In such case, the depth of the cavities 3121 may be set to ensure that the first substrate 301 can be at the same level as the second substrate 302.

As can be seen in FIG. 3E, since the cavities 3121 of the second carrier 312 accommodate the raised structures (i.e., the first electronic components) at one side of the substrate strip, a substantially flat profile can be formed at the other side of the substrate strip during the manufacturing process, therefore mass production can be implemented on the various substrate assemblies at the same time.

Figure 3F:
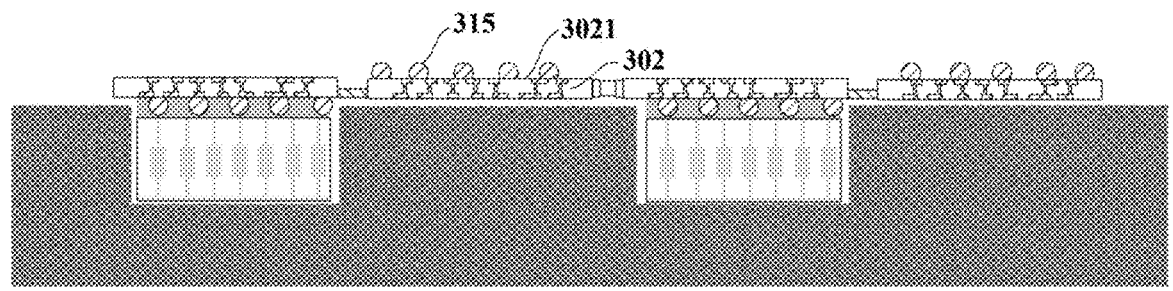

Afterwards, as shown in FIG. 3F, a plurality of bumps 315 are formed over the second mounting surface 3021 of the second substrate 302, and the plurality of bumps 315 as shown in FIG. 3F may have the same or similar structure with the plurality of bumps 306 as shown in FIG. 3B, which will not be elaborated herein.

Figure 3G:
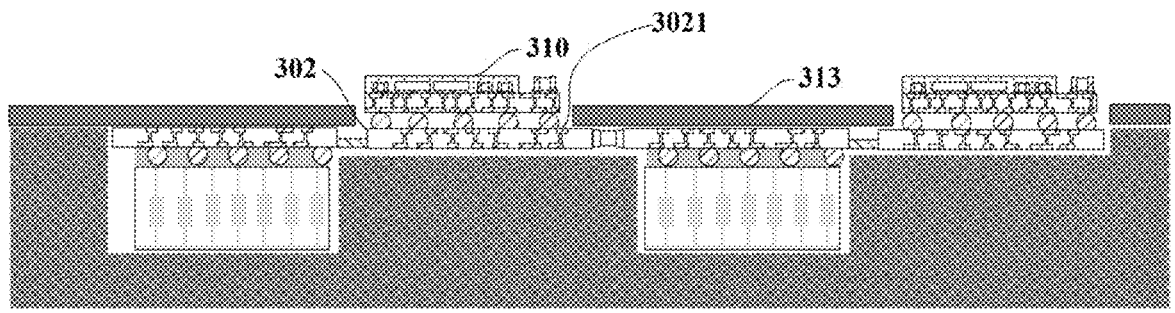

As shown in FIG. 3G, a second electronic component 310 is attached onto the second mounting surface 3021 of the second substrate 302. In some embodiments, similar as the first substrate mask 308, a second substrate mask 313 having a plurality of second openings is also disposed onto the second mounting surface 3021 of the second substrate 302, with each second opening aligned with the second substrate 302 of a substrate assembly. The second opening can expose the second mounting surface 3021. Next, the second electronic component 310 is mounted onto the second mounting surface 3021 of the second substrate 302 through the corresponding second opening.

In some embodiments, the second electronic component 310 is an electronic package, for example, a system-in-package (SIP) device. The electronic package may include a connector such as a board to board (B2B) connector, which allows the second electronic component 310 to be electrically coupled to one or more external devices. In some embodiments, the electronic package may include a plurality of semiconductor dices, semiconductor devices and discrete devices, which are covered by certain encapsulant. In some embodiments, the electronic package is mounted by surface mount technology (SMT). The second electronic component 310 may be passive or active devices as desired to implement any given electrical functionality within the semiconductor package being formed. The second electronic component 310 may be active devices such as semiconductor dice, semiconductor packages, discrete transistors, discrete diodes, etc. The second electronic component 310 may also be passive devices such as capacitors, inductors, or resistors. In some embodiments, an electromagnetic interference (EMI) shielding is formed on the top surface and side surface of the electronic package to encapsulate the electronic package.

Figure 3H:
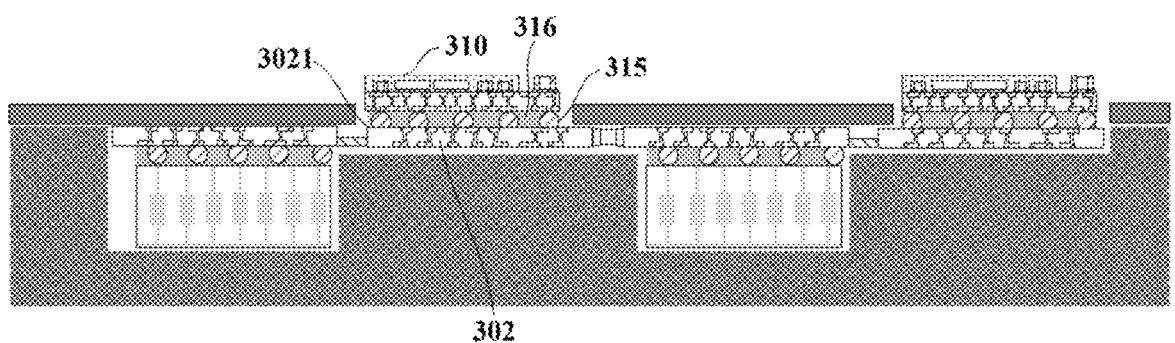

As shown in FIG. 3H, each second electronic component 310 is clamped onto the respective second mounting surface 3021 via a plurality of bumps 315. For example, the corners of the second electronic component 310 may be pressed against the bumps 315. Next, an encapsulant 316 can be injected into a gap between the second electronic component 310 and the second mounting surface 3021 of the second substrate 302 to ensure the encapsulant 316 fully fills the space surrounding the bumps 315. The encapsulant 316 is cured or heated after the injection. The encapsulant 316 may be the same or similar material as the encapsulant 309 as shown in FIG. 3D and thus will not be elaborated herein.

Figure 3I:
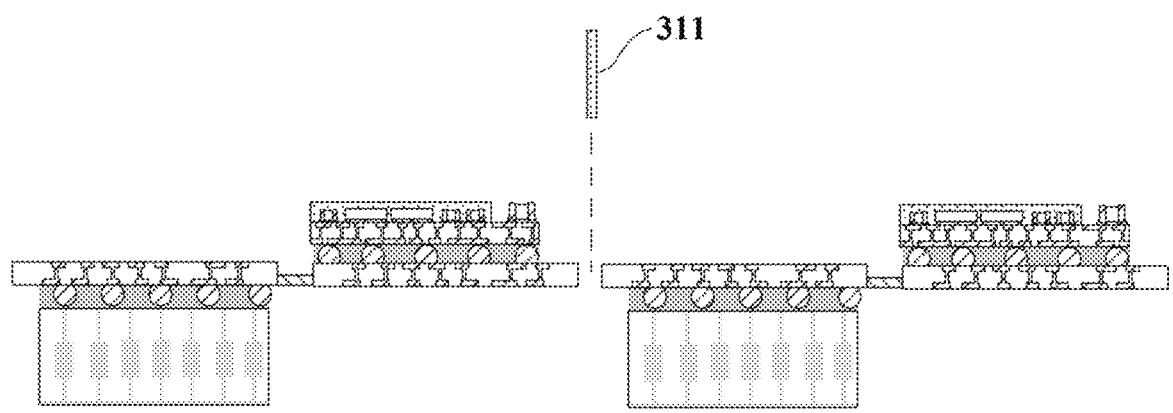

As shown in FIG. 3I, the second substrate mask 313 is removed from the second carrier 312 and the substrate strip can be unloaded from the second carrier 312. Then the substrate strip can be singulated into various substrate assemblies at the respective singulation channels. Specifically, the substrate strip as shown in FIG. 3I can be singulated into the substrate assemblies using a laser ablation tool 311. In some embodiments, a mechanical saw blade also can be used to mechanically singulate the singulation channels.

Afterwards, the flexible link between the first substrate and the second substrate of each substrate assembly can be bent at an angle of approximately 90 degrees, similar as the electronic package shown in FIGS. 1 and 2. As such, the first substrate can be substantially perpendicular to the second substrate. It can be appreciated that the flexible link can be bent at another angle such as an angle ranging from 15 degrees to 165 degrees, as desired. In some embodiments, the process of bending the flexible link can be as follows: (a) a substrate assembly is loaded on a seating fixture, for example, the second electronic component may face away from a surface of the seating fixture and the first electronic component may face towards the surface of the seating fixture; (b) the substrate assembly are clamped to fix the substrate assembly, and the flexible link of the substrate assembly is heated by a conductive heating rod on the seating fixture, which makes the flexible link be bent easily; (c) the first substrate is pushed upward as a first bending by a bottom cylinder such that the first substrate and the second substrate are formed in L-shaped configuration between 90 degrees and 180 degrees; then (d) the first substrate is pushed as a second bending by a left cylinder such that the first substrate and the second substrate formed in L-shaped configuration at approximately 90 degrees. The position and angle between the first substrate and the second substrate are fixed and (e) the substrate assembly is unloaded from the seating fixture finally.

The method of making an electronic package is exemplarily described with references to FIGS. 3A to 3I, however, various modifications or changes can be made to the method and the electronic package made using the method. For example, the second electronic component may be disposed on a second substrate first, and then the first electronic component can be disposed on a first substrate. Also, one or more first electronic components can be mounted on a first substrate and one or more second electronic components can be mounted on a second substrate.

Figure 4:
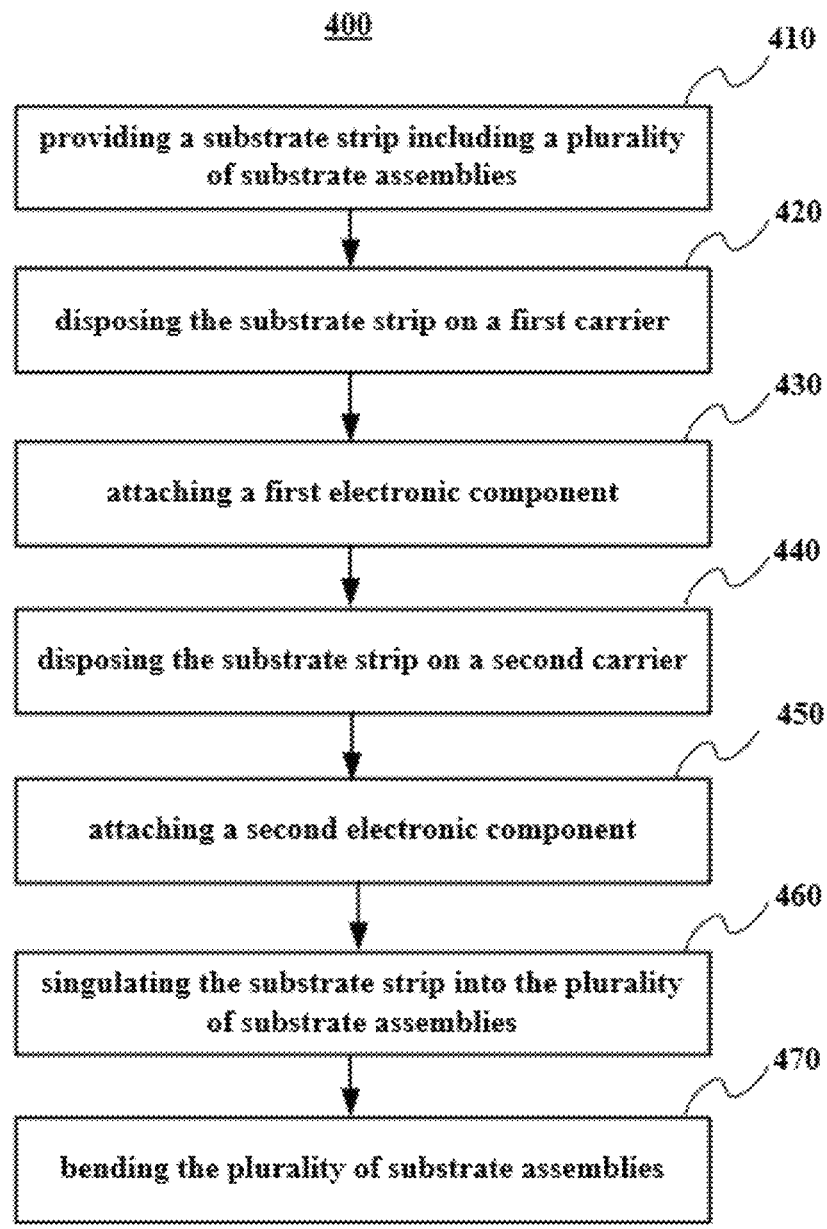
FIG. 4 is a flowchart illustrating the method of making the electronic package as shown in FIGS. 3A to 3I.

Referring to FIG. 4, a flowchart illustrating a method 400 of making an electronic package 100 as shown in FIG. 1 is illustrated according to an embodiment of the present application. As illustrated in FIG. 4, the method 400 may begin at block 410, and a substrate strip including a plurality of substrate assemblies is provided. Then, at block 420, the substrate strip is disposed on a first carrier. At block 430, a first electronic component is attached onto the first substrate. At block 440, the substrate strip is disposed on a second carrier with a plurality of cavities. At block 450, a second electronic component is attached onto the second substrate. At block 460, the substrate strip is singulated into the plurality of substrate assemblies. Afterwards, at block 470, the substrate assemblies are bent.

While the processes for making an electronic package are illustrated in conjunction with corresponding figures, it will be understood by those skilled in the art that modifications and adaptations to the process may be made without departing from the scope of the present invention.

The discussion herein included numerous illustrative figures that showed various portions of a semiconductor device and a method of manufacturing thereof. For illustrative clarity, such figures did not show all aspects of each example assembly. Any of the example devices and/or methods provided herein may share any or all characteristics with any or all other devices and/or methods provided herein. It could be understood that embodiments described in the context of one of the devices or methods are analogously valid for the other devices or methods. Similarly, embodiments described in the context of a device are analogously valid for a method, and vice versa. Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

Various embodiments have been described herein with reference to the accompanying drawings. It will, however, be evident that various modifications and changes may be made thereto, and additional embodiments may be implemented, without departing from the broader scope of the invention as set forth in the claims that follow. Further, other embodiments will be apparent to those skilled in the art from consideration of the specification and practice of one or more embodiments of the invention disclosed herein. It is intended, therefore, that this application and the examples herein be considered as exemplary only, with a true scope and spirit of the invention being indicated by the following listing of exemplary claims.

The invention claimed is:

1. A method for making an electronic package, the method comprising:
   providing a substrate strip comprising a plurality of substrate assemblies, wherein each substrate assembly comprises a first substrate and a second substrate that is connected to the first substrate via a flexible link, and wherein the first substrate of each substrate assembly comprises a first mounting surface and the second substrate of each substrate assembly comprises a second mounting surface that is not at a same side of the substrate assembly as the first mounting surface;

disposing the substrate strip on a first carrier such that the first mounting surface of each first substrate is facing away from the first carrier and the second mounting surface of each second substrate is facing towards the first carrier;

attaching a first electronic component onto the first mounting surface of each first substrate;

disposing the substrate strip on a second carrier with a plurality of cavities, such that the first mounting surface of each first substrate is facing towards the second carrier and the second mounting surface of the second substrate is facing away from the second carrier, and the first electronic component attached onto each first substrate is received within one of the plurality of cavities;

attaching a second electronic component onto the second mounting surface of each second substrate;

singulating the plurality of substrate assemblies from each other; and bending the flexible link of each substrate assembly to form an angle between the first substrate and the second substrate of each substrate assembly.

2. The method of claim 1, wherein before attaching the first electronic component onto the first mounting surface of each first substrate, the method further comprises:

forming a plurality of bumps over the first mounting surface of each first substrate.

3. The method of claim 1, wherein the first carrier comprises a substrate strip cavity to receive the substrate strip.

4. The method of claim 1, attaching the first electronic component onto the first mounting surface of each first substrate further comprises:

disposing a first substrate mask having a plurality of first openings on the substrate strip, wherein each first opening is aligned with the first substrate of each substrate assembly to expose the first mounting surface;

mounting the first electronic component onto the first mounting surface of each first substrate through the corresponding first opening; and removing the first substrate mask from the first carrier.

5. The method of claim 1, wherein before attaching the second electronic component onto the second mounting surface of each second substrate, the method further comprises:

forming a plurality of bumps over the second mounting surface of each second substrate.

6. The method of claim 1, wherein attaching the second electronic component onto the second mounting surface of each second substrate further comprises:

disposing a second substrate mask having a plurality of second openings on the substrate strip, wherein each second opening is aligned with the second substrate of a substrate assembly to expose the second mounting surface;

mounting the second electronic component onto the second mounting surface of each second substrate through the corresponding second opening; and removing the second substrate mask from the second carrier.

7. The method of claim 1, wherein the first electronic component is an antenna.

8. The method of claim 1, wherein the second electronic component is an electronic package.

9. The method of claim 1, wherein each of the plurality of cavities has a depth greater than a height of the first electronic component.

\* \* \* \* \*